United States Patent
Smith et al.

(10) Patent No.: US 12,042,770 B2
(45) Date of Patent: Jul. 23, 2024

(54) PRECISION FABRICATION OF NANOSIEVES

(71) Applicant: International Business Machines Corporation, Armonk, NY (US)

(72) Inventors: Joshua T. Smith, Croton on Hudson, NY (US); Stacey Gifford, Fairfield, CT (US); Sung-Cheol Kim, New York, NY (US); Benjamin Wunsch, Mt. Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 438 days.

(21) Appl. No.: 17/520,713

(22) Filed: Nov. 7, 2021

(65) Prior Publication Data

US 2022/0055893 A1    Feb. 24, 2022

Related U.S. Application Data

(62) Division of application No. 16/276,342, filed on Feb. 14, 2019, now Pat. No. 11,186,480.

(51) Int. Cl.
*B01D 71/02* (2006.01)
*B01D 29/00* (2006.01)
(Continued)

(52) U.S. Cl.
CPC ..... *B01D 71/0213* (2022.08); *B01D 29/0093* (2013.01); *B01D 29/44* (2013.01);
(Continued)

(58) Field of Classification Search
CPC ........... B01D 71/0213; B01D 29/0093; B01D 29/44; B01L 3/502707; B01L 3/502753;
(Continued)

(56) References Cited

U.S. PATENT DOCUMENTS

| 8,771,933 B2 | 7/2014 | Han et al. |
| 8,783,466 B2 | 7/2014 | Han et al. |

(Continued)

FOREIGN PATENT DOCUMENTS

WO    2016/044710 A1    3/2016

OTHER PUBLICATIONS

S. H. Ko et al., Nanofluidic device for continuous multiparameter quality assurance of biologics. Nature nanotechnology, vol. 12(8), Aug. 2017, pp. 804-814.

(Continued)

*Primary Examiner* — Brian J. Sines
(74) *Attorney, Agent, or Firm* — James Olsen; Otterstedt & Kammer PLLC

(57) ABSTRACT

An exemplary method includes forming a sacrificial layer along sidewalls of an array of trenches that are indented into a substrate, depositing a fill layer over the sacrificial layer, and then creating an array of gaps between the fill layer and the substrate by removing the sacrificial layer along the sidewalls of the trenches, while maintaining a structural connection between the substrate and the fill layer at the floors of the trenches. The method further includes covering the substrate, the fill layer, and the gaps with a cap layer that seal fluid-tight against the substrate and the fill layer. The method further includes indenting a first reservoir and a second reservoir through the cap layer, and into the substrate and the fill layer, across the lengths of the array of gaps, so that the array of gaps connects the first reservoir in fluid communication with the second reservoir.

4 Claims, 10 Drawing Sheets

(51) Int. Cl.
*B01D 29/44* (2006.01)
*B01L 3/00* (2006.01)
*B81C 1/00* (2006.01)

(52) U.S. Cl.
CPC ... *B01L 3/502707* (2013.01); *B01L 3/502753* (2013.01); *B01L 3/502761* (2013.01); *B01L 3/565* (2013.01); *B81C 1/00119* (2013.01); B01L 2300/0861 (2013.01); B01L 2300/0896 (2013.01); B01L 2300/12 (2013.01); B01L 2400/0487 (2013.01); *B81C 2201/0109* (2013.01); *B81C 2201/0132* (2013.01); *B81C 2201/0133* (2013.01)

(58) Field of Classification Search
CPC ............... B01L 3/502761; B01L 3/565; B01L 2300/0861; B01L 2300/12; B81C 1/00119; B81C 2201/0133; B01C 2201/0109; B01C 2201/0132
See application file for complete search history.

(56) References Cited

U.S. PATENT DOCUMENTS

| | | | |
|---|---|---|---|
| 9,272,273 | B2 | 3/2016 | Kim et al. |
| 9,914,118 | B2 | 3/2018 | Astier et al. |
| 11,186,480 | B2 * | 11/2021 | Smith ............... B01L 3/502707 |
| 2007/0090026 | A1 | 4/2007 | Han |
| 2017/0043339 | A1 | 2/2017 | Astier et al. |
| 2017/0045475 | A1 | 2/2017 | Astier et al. |
| 2017/0246633 | A1 | 8/2017 | Ko et al. |
| 2020/0262698 | A1 | 8/2020 | Smith |

OTHER PUBLICATIONS

S. H. Ko et al., One-Step Protein Analysis Using Slanted Nanofilter Array, 18th International Conference on Miniaturized Systems for Chemistry and Life Sciences, Oct. 26-30, 2014, San Antonio, Texas, pp. 2417-2419.

S.H. Ko et al., A Nanofluidic Device for Rapid Biologics Quality Control, 19th International Conference on Miniaturized Systems for Chemistry and Life Sciences, Oct. 25-29, 2015, Gyeongju, Korea, pp. 329-331.

J. Rouhi et al., Controlling the shape and gap width of silicon electrodes using local anodic oxidation and anisotropic TMAH wet etching, Semiconductor Science and Technology, 27 (Apr. 2012) 065001, pp. 1-11.

J. Fu et al., A patterned anisotropic nanofluidic sieving structure for continuous-flow separation of DNA and proteins, Nature Nanotechnology, vol. 2, Feb. 2007. pp. 121-128.

Paul J. Otterstedt, List of IBM Patents or Patent Applications Treated as Related, 2 Pages, Nov. 7, 2021.

* cited by examiner

PRECISION FABRICATION OF NANOSIEVES

CROSS-REFERENCE TO RELATED APPLICATION

This application is a division of U.S. patent application Ser. No. 16/276,342 filed 02-14-2019, the complete disclosure of which is expressly incorporated herein by reference in its entirety for all purposes.

BACKGROUND

The present invention relates to the material arts, and more specifically, to fabrication of micro-electro-mechanical structures (MEMS) or even nanoscale structures.

Analytical protein purification involves isolation of one or a few proteins in relatively small amounts for a number of research or analytical purposes, including identification, quantification, and studies of the protein's structure, post-translational modifications and function. Common techniques for separating proteins by size or molecular weight include size exclusion chromatography or gel electrophoresis (e.g. SDS-PAGE). Such methods are widely employed to check the purity of protein-based drugs in pharmaceutical manufacturing processes and are also used to ensure the absence of impurities, such as protein aggregates.

Optimally, on-site drug purity (e.g. biologics device) and efficacy monitoring tests would be implemented in a portable adaptation, requiring, for example, a lab-on-a-chip (LOC) approach. To this end, an asymmetric nanofilter array (ANA) device can be used in a one step, continuous-flow protein analysis device capable of both preconcentration and size-based protein separation that enhances the detection of the ANA chip, enabling it to match or exceed the sensitivity of a standard SDS-PAGE. This device uses a single inlet and outlet and the preconcentration and separation features include slanted nanochannel/nanofilter arrays with a shallow region of 20-100 nanometers (nm) dimension and a deep region of 100-300 nm dimension that together form a sieve. In such a device, fluid with suspended particles flows from a deep region through a shallow region to another deep region. The shallow region prevents passage of particles that are larger than the depth of the shallow region.

SUMMARY

Principles of the invention provide techniques for precision fabrication of nanosieves. In one aspect, an exemplary method includes forming a sacrificial layer along sidewalls of an array of first trenches that are indented into a surface of a substrate, depositing a fill layer over the sacrificial layer, and then creating an array of gaps between the fill layer and the substrate by removing the sacrificial layer along the side walls of the first trenches, while maintaining a structural connection between the substrate and the fill layer at the floors of the first trenches. The array of gaps extends along the lengths of the array of first trenches. The method further includes covering the substrate, the fill layer, and the array of gaps with a cap layer that forms a fluid-tight seal against the substrate and the fill layer. The method further includes indenting a first reservoir and a second reservoir through the cap layer, and into the substrate and the fill layer, across the lengths of the array of gaps, so that the array of gaps connects the first reservoir in fluid communication with the second reservoir.

In another aspect, an exemplary apparatus includes a substrate with an array of first trenches formed in the substrate and with a fill layer deposited into the array of first trenches, so that an array of gaps exists between the fill layer and side walls of the array of first trenches. The apparatus also includes first and second reservoirs indented through the fill layer and into the substrate across the array of first trenches, so that the array of gaps connect the first reservoir in fluid communication with the second reservoir. Furthermore, the apparatus includes a cap layer deposited over the substrate and the fill layer to fluidly seal the array of gaps.

In another aspect, an exemplary apparatus includes a substrate with an array of first trenches formed in the substrate and with a fill layer deposited into the array of first trenches, so that an array of gaps exists between the fill layer and side walls of the array of first trenches. The apparatus includes first and second reservoirs indented through the fill layer and into the substrate across the array of first trenches, so that the array of gaps connect the first reservoir in fluid communication with the second reservoir. The apparatus also includes a cap layer deposited over the substrate and the fill layer to fluidly seal the array of gaps. Furthermore, the apparatus includes a pump for pressurizing the first reservoir to drive fluid flow from the first reservoir through the array of gaps into the second reservoir.

In view of the foregoing, techniques of the present invention can provide substantial beneficial technical effects. For example, one or more embodiments provide one or more of:

Forming arrays of nanosieve devices at high throughput.

Forming arrays of nanosieve devices with unprecedented dimensional precision.

Forming arrays of nanosieve devices that can filter particles smaller than 40 nm smallest dimension.

Forming features with less than 10 nm dimensional tolerance by oxidation and etching.

Forming nanosieve devices within an asymmetric slanted nanochannel array configuration for separation and isolation of particles and molecules smaller than 40 nm.

These and other features and advantages of the present invention will become apparent from the following detailed description of illustrative embodiments thereof, which is to be read in connection with the accompanying drawings.

DETAILED DESCRIPTION

Embodiments of the present invention use vertical nanosieves in conjunction with a slanted nanochannel (reservoir) array layout to achieve higher resolution in size-based protein and small molecule separation. The vertical nanosieve gaps, which determine separation resolution, are defined using highly controllable formation of a sacrificial thermal oxide and subsequent wet etch removal of the oxide, processes that can control the size of the nanosieves down to a minimum critical dimension (CD) of 2 nm. Due to the sieve orientation, the dimensions of this structure are highly reproducible when scaled to larger areas, which enhances manufacturability.

Figure 1:
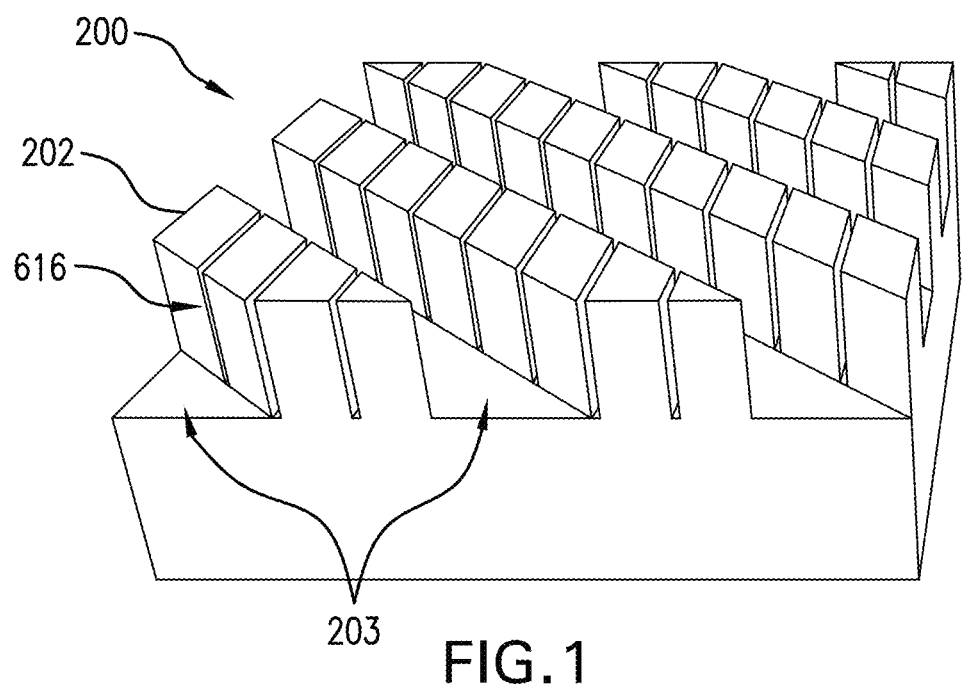
FIG. 1 depicts a nanosieve filter array with vertical nanosieve gaps, according to an exemplary embodiment.

FIG. 1 depicts a portion of a continuous-flow nanosieve separator 200, according to an exemplary embodiment, in which walls 202 define nanochannels (reservoirs) 203 that have a 135° slant. Vertical nanosieve gaps 616 (further discussed below with reference to FIG. 14) split the walls and connect the reservoirs 203 in fluid communication with each other. FIG. 1 shows the nanosieve separator 200 without its cap layer, which fluidly seals the separator, in order to better show the details of the underlying structures. In the structure of FIG. 1, the vertical nanosieve gaps 616 that are created by sacrificial processes, as described below, offer greater scaling potential than state-of-the-art lithographic techniques and result in improved separation resolution by being smaller in width than previously reported structures. By selectively pressurizing and draining adjacent nanochannels in the array of reservoirs 203, the arrays of nanosieve gaps 616 can be used to separate particulate matter from fluid that flows from pressurized (first) reservoirs to drained (second) reservoirs.

Figure 2:
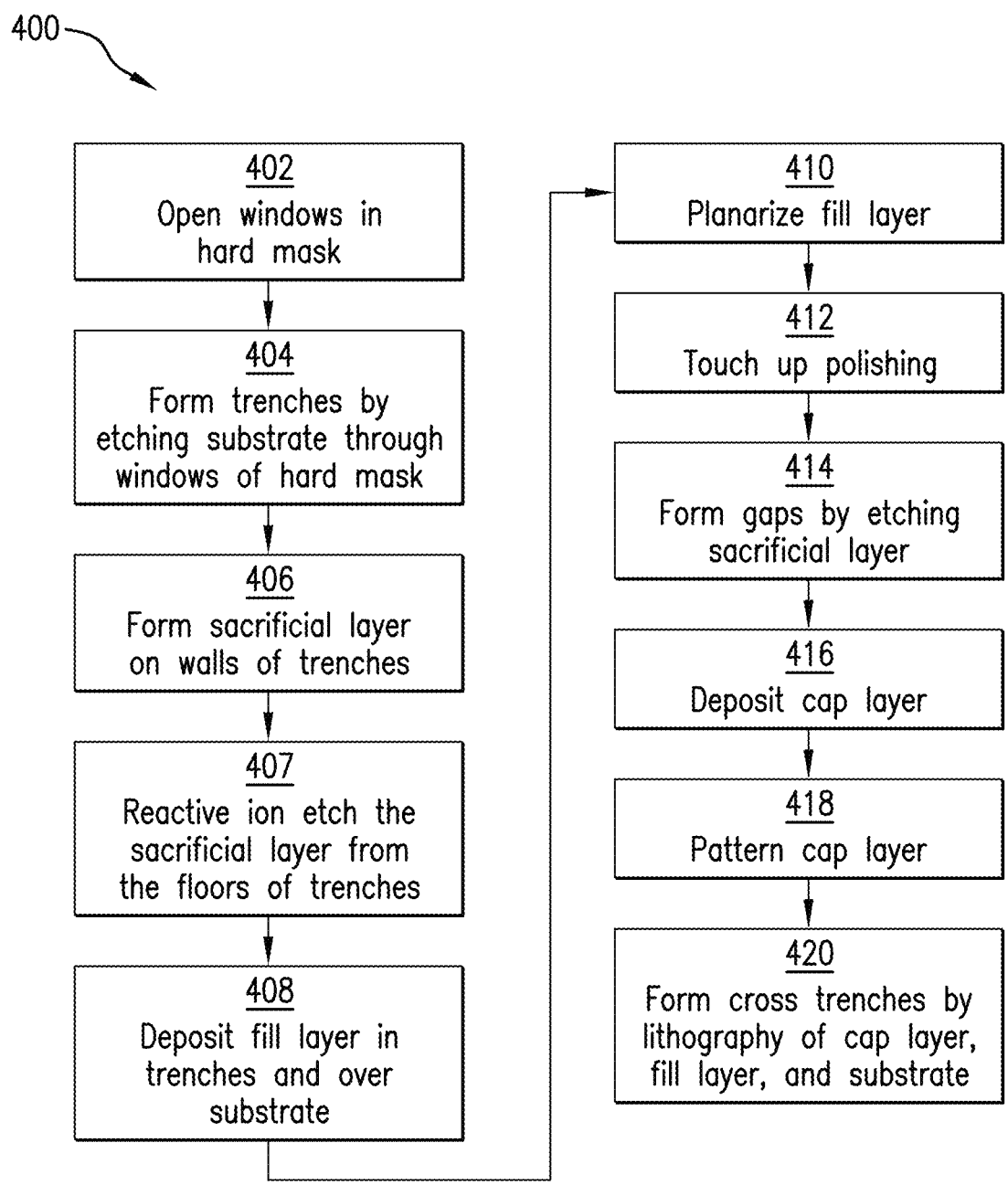
FIG. 2 depicts a process for fabricating a nanosieve filter array with vertical nanosieve gaps, according to an exemplary embodiment.

Referring to FIG. 2, vertical nanosieve gaps are formed in a silicon wall between adjacent reservoirs, according to a fabrication process 400 that is further illustrated by and discussed with reference to FIGS. 4-18.

Figure 3:
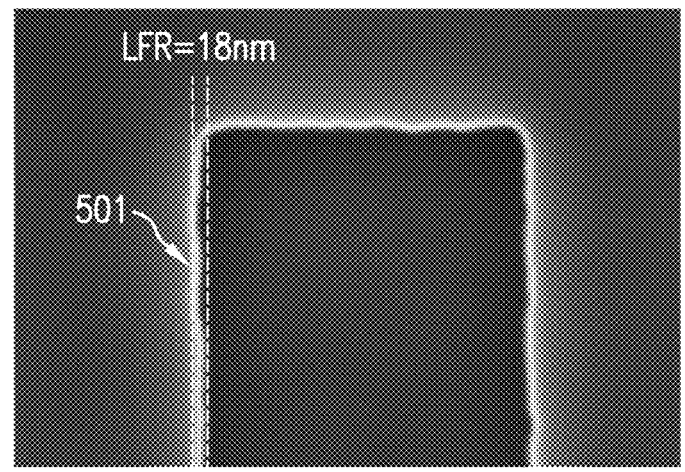
FIG. 3 depicts a scanning electron microscope (SEM) image of line edge roughness (LER) obtained by electron beam lithography of a silicon dioxide hard mask.

In the case of the vertical nanosieve arrays, the process includes wet etch removal of a sacrificial silicon oxide layer via chemistries such as dilute hydrofluoric acid, e.g., 10:1 deionized water:hydrofluoric acid. Etching of the sacrificial oxide layer, which can be grown conformally across arbitrary area and structures to a thickness that is precise within 2 nanometers (nm), advantageously enables the process 400 to overcome line edge roughness (LER) limitations of the lithographic techniques presently used to manufacture micro-electro-mechanical structures (MEMS) such as nanosieves. In particular, the 2 nm precision of thickness for forming the sacrificial oxide layer is beyond projected resolution of achievable technology nodes in the International Technology Roadmap for Semiconductors (ITRS). As one example of resolution limitations, see FIG. 3 for a scanning electron microscope (SEM) image that depicts approximately 18 nm LER around the edge 501 of a hard mask opening that was formed by e-beam lithography in combination with reactive-ion etching (ME).

Figure 4:
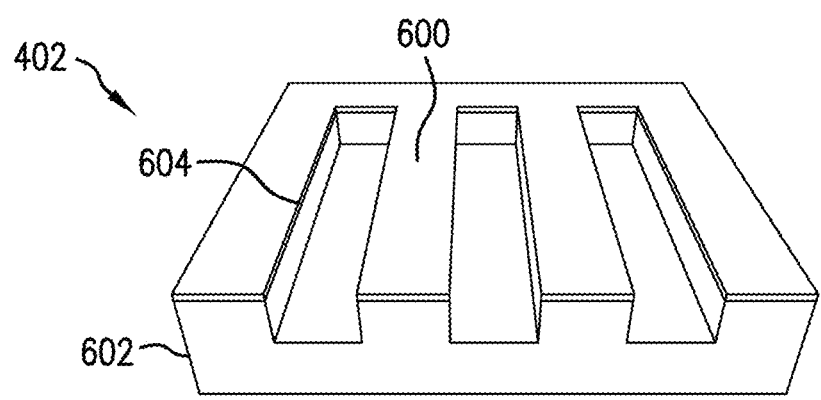
FIG. 4 depicts in perspective view a structure that results from a hard mask patterning step of the process of FIG. 2.
Figure 5:
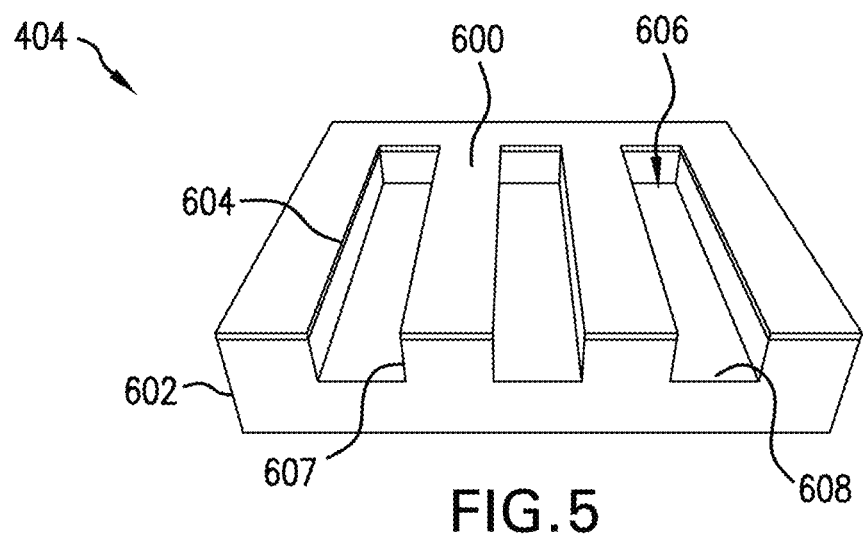
FIG. 5 depicts in perspective view a structure that results from a trench etching step of the process of FIG. 2.
Figure 6:
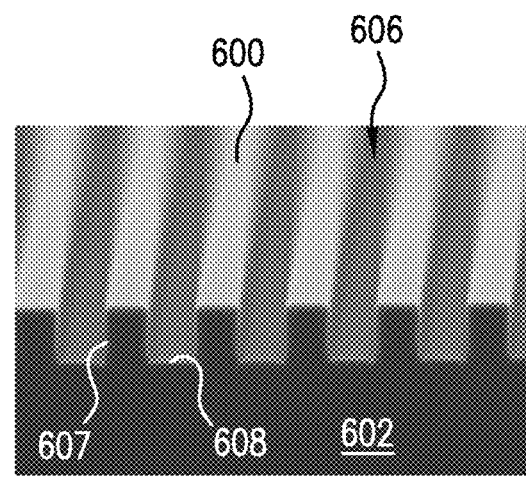
FIG. 6 depicts an SEM image of the structure shown in FIG. 5.

Considering FIGS. 4 and 5, and still referring to FIG. 2, the process 400 begins with a hard mask (HM) 600 on a silicon substrate 602. At 402, windows 604 are opened in the HM 600 by lithography (e.g., electron beam lithography, although lower-cost and lower-energy techniques such as deep ultraviolet (DUV) lithography (e.g. 193 nm wavelength) equally can be used because the subsequent steps mitigate LER concerns) in combination with wet etching or RIE. At 404, trenches 606 are formed in the silicon substrate 602 by etching the exposed silicon through the openings 604. FIG. 6 shows an SEM image of trenches 606 formed in substrate 602.

In one or more embodiments, where vertical nanosieve gaps are to be formed, reactive-ion etching (RIE) is used to remove material from the substrate with vertical anisotropy, i.e. forming a relatively straight-walled trench with a rectilinear cross section. Although walls 607 and floors 608 of the trench may not be atomically smooth, irregularity of these surfaces is mitigated by subsequent steps as discussed below.

Figure 7:
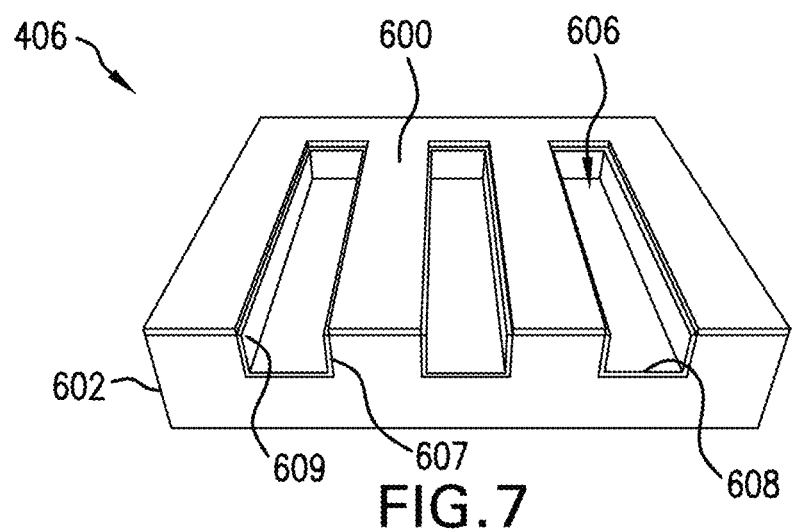
FIG. 7 depicts in perspective view a structure that results from a sacrificial layer growth step of the process of FIG. 2.
Figure 8:
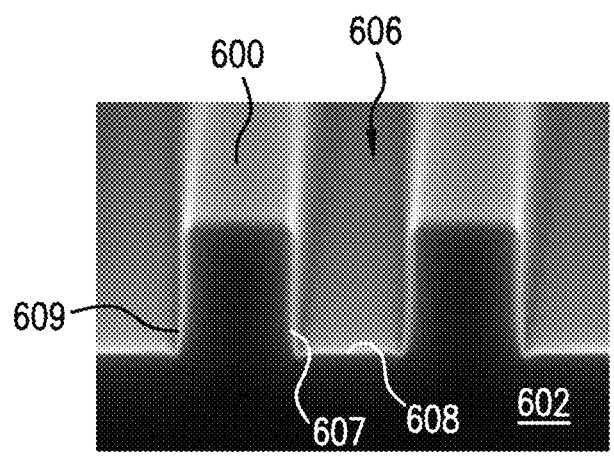
FIG. 8 depicts an SEM image of the structure shown in FIG. 7.

Referring to FIG. 7, the process 400 continues at 406 by forming a sacrificial layer 609 on the walls 607 and floors 608 of the trenches 606, e.g., using dry oxidation to conformally grow on the walls of the trenches 606 a high-quality 10 nm thickness sacrificial layer 609 of silicon dioxide ($SiO_2$). FIG. 8 shows an SEM image of the sacrificial layer 609 on the walls 607 and the floors 608. Practically, thin $SiO_2$ layers from 2-10 nm can be grown with a +/−10% tolerance in the thickness target—i.e., less than 2 nm tolerance. Other techniques for forming the sacrificial layer 609 include atomic layer deposition (ALD) or epitaxy, in which cases the sacrificial layer 609 need not necessarily be $SiO_2$ although it should be a material that etches selectively under one or more chemistries that preserve bulk silicon. In subsequent steps, the uniformity of the oxide thickness results in consistent gap sizes below even the theoretical limit of e-beam lithography capabilities (~6 nm), enabling state-of-the-art scaling capabilities in a reproducible fashion over a wafer scale in a cost-effective manner.

Because oxidation or deposition techniques can be controlled with nanometer or even sub-nanometer precision (e.g., atomic layer deposition), the gap size can be scaled to a regime not achievable by even the most sophisticated and expensive lithography systems on the market. With such a smooth starting surface, polysilicon deposition on the opposite side of the sacrificial material mirrors the silicon substrate face of the sidewalls, creating a pristine nanogap when the sacrificial layer is etched away following chemical mechanical polishing (CMP). The small nanogap dimensions enable deposition of a capping layer to seal the nanosieve for nanofluidic applications without filling the gap back up.

Figure 9:
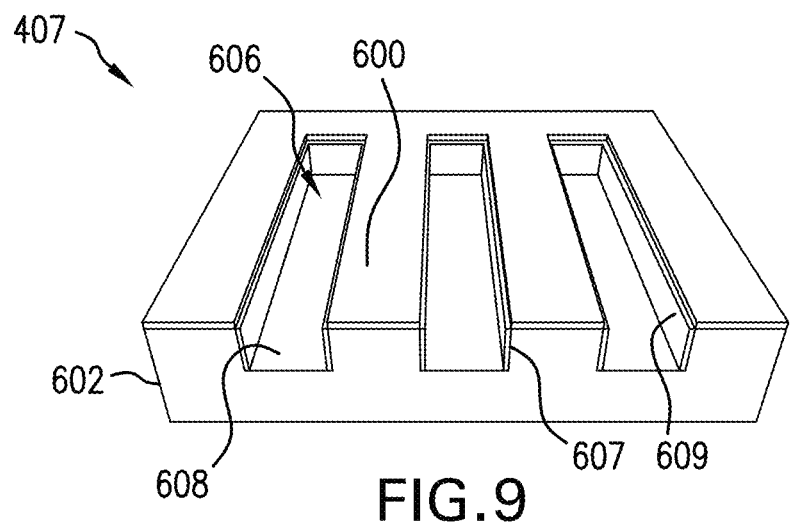
FIG. 9 depicts in perspective view a structure that results from a reactive-ion etching step of the process of FIG. 2.

FIG. 9 depicts a structure resulting from step 407 of reactive-ion etching (ME) the sacrificial layer 609 away from the floors 608 of the trenches 606. This step exposes the trench floors 608 for a subsequent step 408 (described with reference to FIGS. 10 and 11) of depositing a fill layer 610 into the trenches 606. By exposing the trench floors 608, the fill layer 610 can adhere directly to the substrate 602, which can prevent over-etch of the sacrificial layer 609 in further steps as discussed below.

Figure 10:
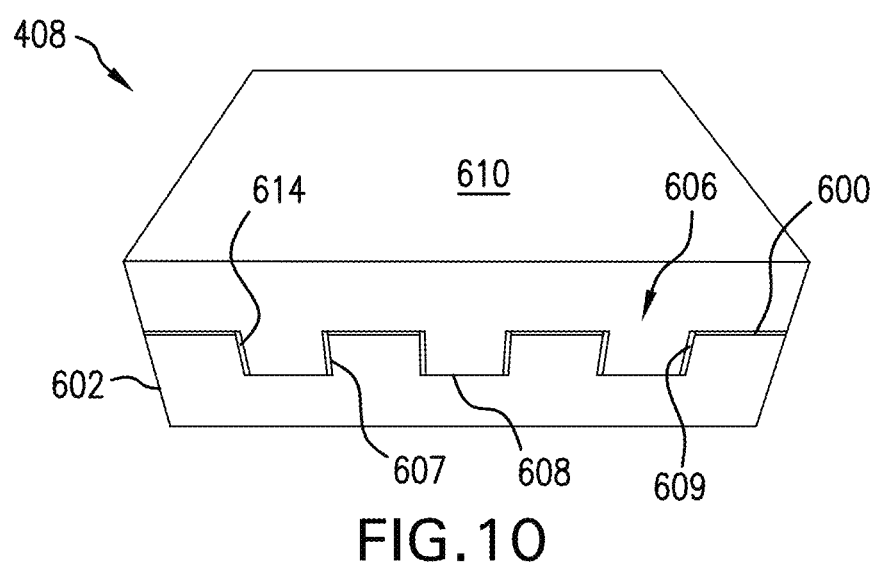
FIG. 10 depicts in perspective view a structure that results from a fill layer deposition step of the process of FIG. 2.
Figure 11:
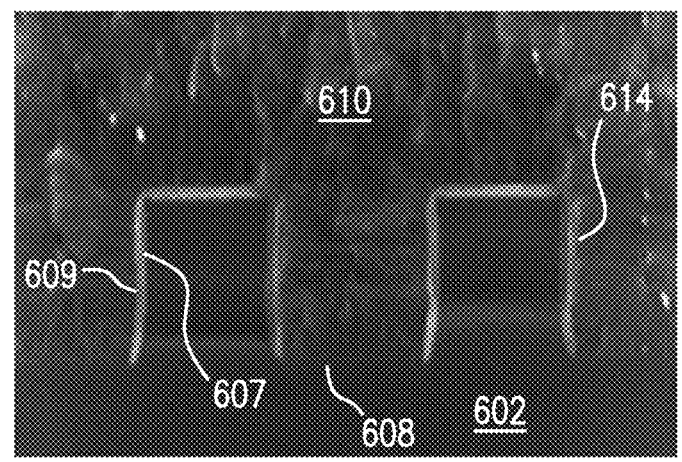
FIG. 11 depicts an SEM image of the structure shown in FIG. 10.

FIG. 10 depicts a structure resulting from step 408 of depositing the fill layer 610, e.g., polysilicon. In one or more embodiments for forming vertical nanosieve gaps, the portion of the sacrificial layer 609 that covers the floor of the trench 606 can be removed by step 407 of RIE before depositing the fill layer 610. FIG. 11 depicts an SEM image of the fill layer 610 on the substrate 602. The fill layer 610 backfills the trenches 606 and also covers the hard mask 600, preparing the overall structure for planarization (e.g., chemical mechanical polishing or CMP). By backfilling the trenches, the polysilicon fill layer 610 forms walls 614 at the exposed side of the sacrificial layer 609. Thus, together the bulk silicon 602 and the polysilicon fill layer 610 form walls 607, 614 on either side of the sacrificial layer 609 that is located on the sidewalls 607 of the trenches 606. According to an exemplary embodiment, low pressure chemical vapor deposition (LPCVD) was experimentally used to deposit several hundred nanometers thickness of polysilicon to backfill the trenches 606 and completely cover the HM 600. Although other options exist for filling the trenches 606, polysilicon provides at least three advantageous features: (1) it can be highly selectively polished compared to the hard mask material (typically $SiO_2$); (2) similar to crystalline silicon substrate 602 it is extremely resistant to etch chemistries used to remove a silicon dioxide sacrificial layer 609 in downstream processing; and (3) it can form a thin native oxide or have a thin thermal oxide grown on its surface similar to the bulk silicon substrate 602. Formation of the similar oxide, which is hydrophilic, is advantageous for nanofluidics because it enhances wetting of the gap feature that will be formed in subsequent steps and is easily chemically modified for compatibility with various biological samples using different surface chemistries.

Figure 12:
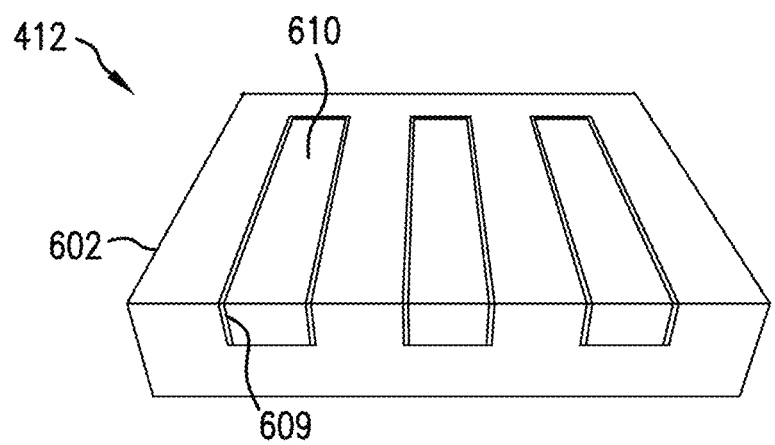
FIG. 12 depicts in perspective view a structure that results from a planarization step of the process of FIG. 2.
Figure 13:
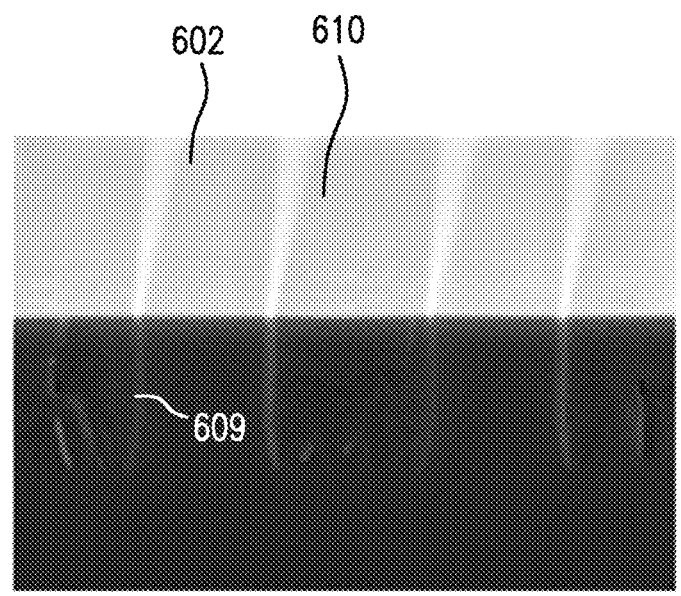
FIG. 13 depicts an SEM image of the structure shown in FIG. 12.

FIG. 12 depicts a structure resulting from steps 410 and 412 of planarizing and touching up the fill layer 610 to reveal the substrate 602 (i.e., completely removing the HM 600), e.g., by chemical mechanical polishing (CMP). According to an exemplary embodiment, at step 410 a high rate polysilicon CMP process can be carried out using a slurry highly selective to poly-silicon over $SiO_2$ such as an abrasive silica slurry, here using RDB1001 to planarize the fill layer 610 down to the Sift HM 600 with a significant overpolish margin; i.e., $SiO_2$ in the field region acts as a stop layer. Post-polish atomic force microscopy (AFM) scan indicated that the polysilicon fill layer 610 was recessed below the surface of the 50 nm thick $SiO_2$ hard mask 600. The structure then is touched up at step 412 by further CMP to remove the hard mask and thereby eliminate dishing and roughness of the fill layer 610. At step 412 the underlying silicon substrate 602 is revealed alongside the fill layer 610 in the trenches 606. For example, according to an exemplary embodiment a 60 second CMP using cerium oxide (ceria, $CeO_2$) abrasive slurry such as STI2100F (Da Nano) 6:1 removes line edge roughness (LER) remaining from the lithography of the HM 600, and also removes the polysilicon dish protrusion of the fill layer 610 above the bulk silicon surface of the substrate 602. FIG. 13 depicts an SEM image of the polysilicon fill layer 610, sacrificial layer 609, and bulk silicon substrate 602 following steps 410 and 412.

Figure 14:
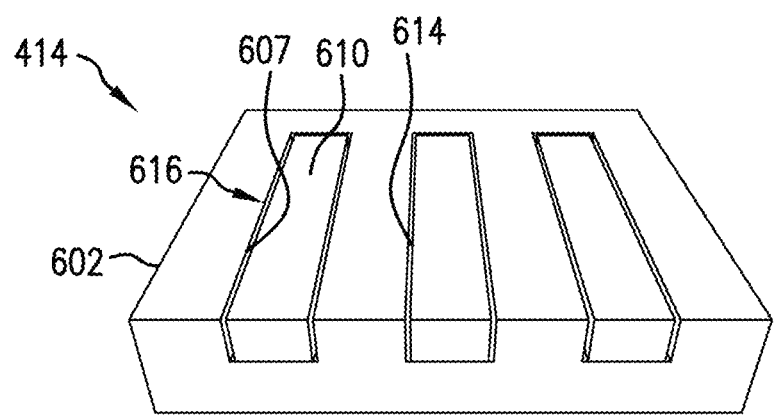
FIG. 14 depicts in perspective view a structure that results from a sacrificial layer removal step of the process of FIG. 2.
Figure 15:
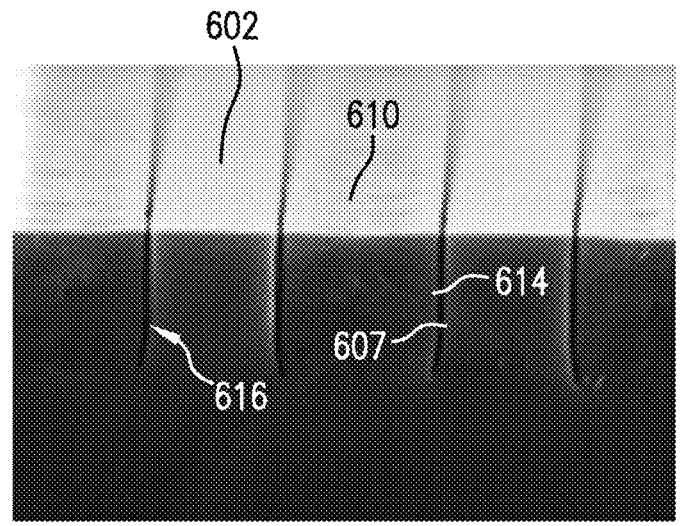
FIG. 15 depicts an SEM image of the structure shown in FIG. 14.

FIG. 14 depicts a structure including the nanosieve gaps 616 that are formed between the walls 607, 614, by step 414 of removing the sacrificial layer 609 (using, for example, dilute hydrofluoric acid to etch the $SiO_2$). Equally, etching could be accomplished using any chemistry that is selective to $SiO_2$ or other sacrificial layer material while preserving silicon. According to an exemplary embodiment, the hydrofluoric acid can be diluted 10:1. Given that the sacrificial layer 609 originally was formed with 10 nm thickness on atomically smooth sidewalls, the result of step 414 is the plurality of nanosieve gaps 616 that are about 10 nm wide. In embodiments with vertical nanosieve gaps, i.e. a rectilinear trench cross section, the sacrificial layer 609 is entirely removed in two different steps. At step 407, previously discussed, RIE removes the portion of the sacrificial layer that covers the bottom of the trench, before deposition of the fill layer 610, so that the fill layer 610 can be deposited directly onto the substrate 602; then in step 414, the remnants of the sacrificial layer are removed from between the substrate 602 and the fill layer 610 by wet chemical etching as discussed. FIG. 15 depicts an SEM image of the structure produced by step 414.

Figure 16:
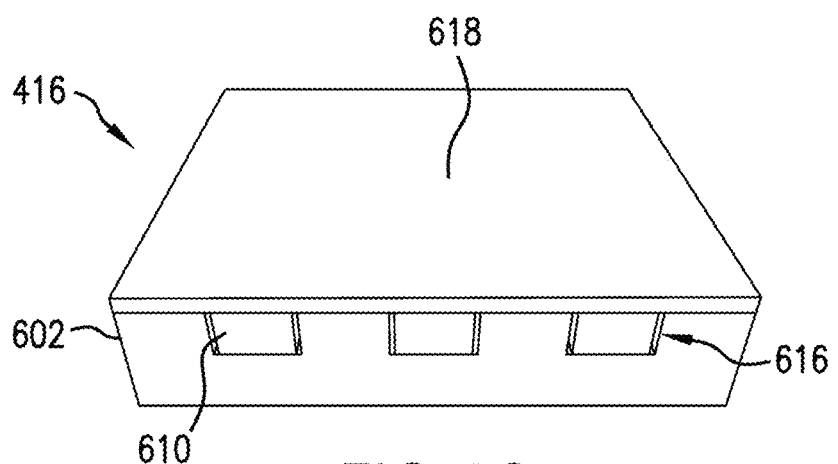
FIG. 16 depicts in perspective view a structure that results from a cap layer deposition step of the process of FIG. 2.

FIG. 16 depicts a structure resulting from step 416 of depositing a cap layer 618 that closes upper ends of the nanosieve gaps 616. The cap layer 618 provides a fluid-tight seal against the fill layer 610 and the substrate 602.

Figure 17:
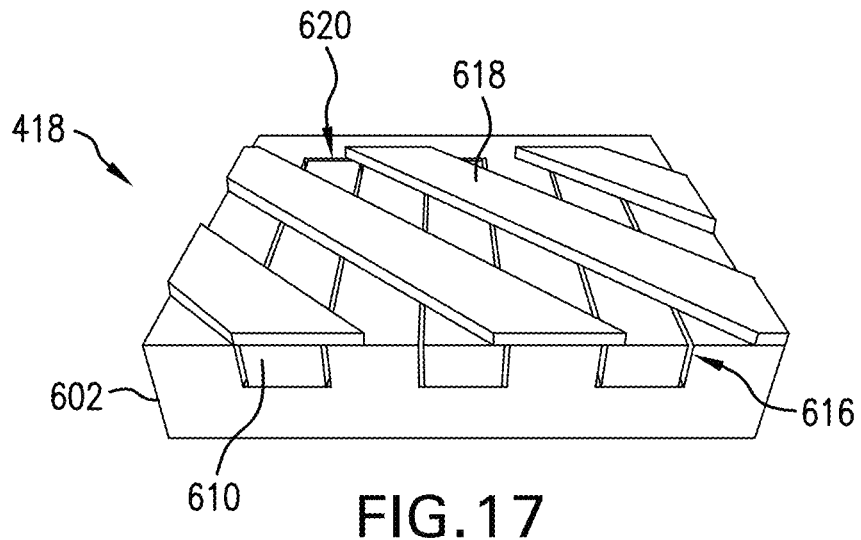
FIG. 17 depicts in perspective view a structure that results from a cap layer patterning step of the process of FIG. 2.

FIG. 17 depicts a structure resulting from step 418 of patterning the cap layer 618 with openings 620 by RIE, preparatory to RIE of the underlying fill layer 610 and substrate 602. In FIG. 17, at the far ends of the cap layer segments, there are gaps where the ends of those segments do not extend over all of the substrate and fill layer. In the subsequent ME of the underlying substrate and fill, those gaps permit the substrate and fill layer to be removed, forming a main reservoir that feeds the separator.

Figure 18:
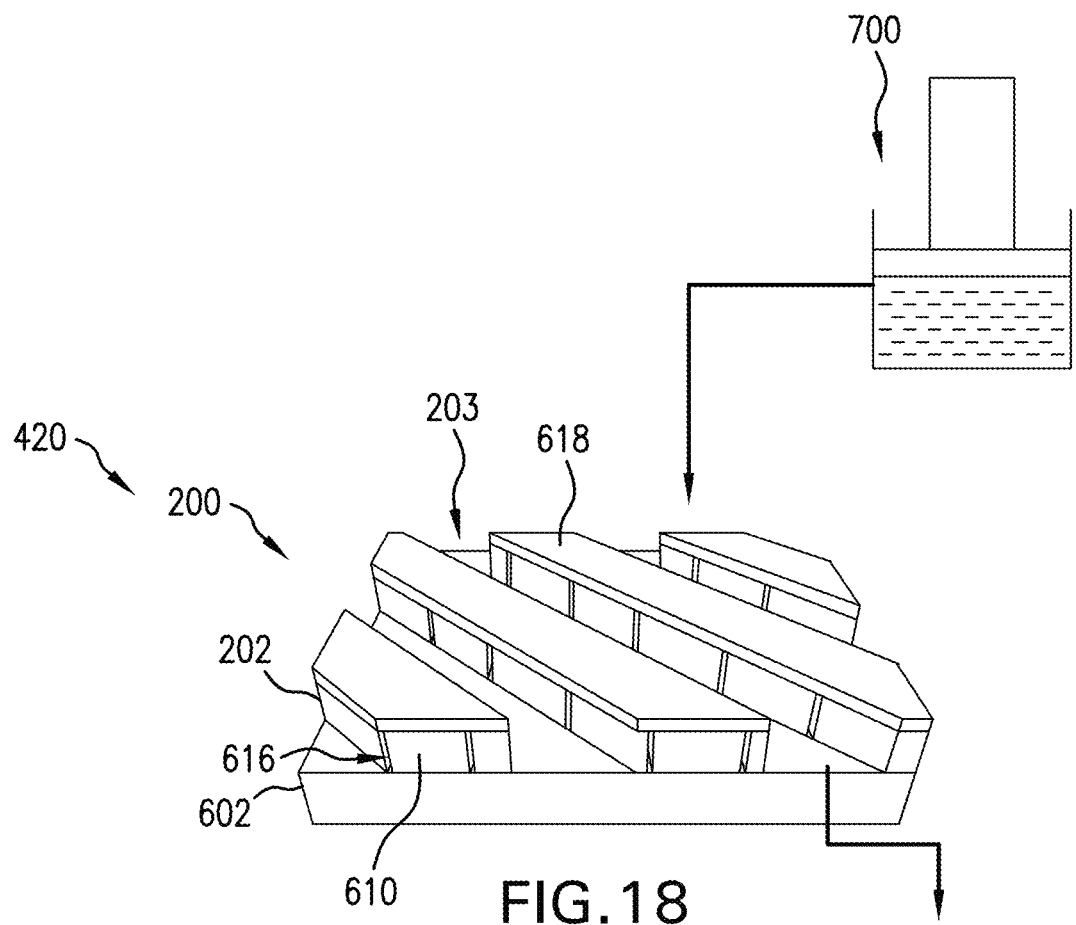
FIG. 18 depicts in perspective view a structure that results from a lithography step of the process of FIG. 2.

FIG. 18 depicts the complete nanosieve separator 200, with vertical nanogaps 616 joining the reservoirs 203, that results from step 420 of forming the reservoirs 203 by removing portions of the fill layer 610 and the substrate 602 (in a non-limiting example, removal by RIE). The reservoirs 203 extend across the gaps 616 such that the gaps fluidly connect the reservoirs 203 with each other. Additionally, a pump 700 can be connected to pressurize a first one of the reservoirs 203 with fluid having suspended particles, while a second (adjacent) one of the reservoirs 203 is drained. Then the array of gaps 616 will act as a nanosieve to separate the suspended particles from the fluid that flows from the first reservoir into the second reservoir.

Considering the process 400, given the teachings herein, it will be appreciated that arrays of nanosieve structures can be fabricated using standard and relatively inexpensive photolithography, deposition, and etching techniques. Once the arrays have been produced, reservoirs adjacent to the arrays can be formed by etching through the ends of each trench. By selectively pressurizing and draining adjacent reservoirs, the arrays can be used to separate particulate matter from fluid that flows from pressurized reservoirs to drained reservoirs.

For fully vertical nanosieves, reactive-ion etching (ME) can be used to form the trenches 606 and potentially also the reservoirs 203. ME exhibits directional anisotropy, i.e. it removes material downward without significantly removing material in the lateral direction. The ME process forms rectangular trenches with vertical side walls. A sacrificial layer is formed on the walls and floors of the trenches, then a fill layer is deposited to form rectangular blocks. Advantageously for the vertical nanosieves, reactive-ion etching enables removal of the sacrificial layer from the bottom of the trench floor while keeping it intact on the side walls (similar to spacers for vertical transistors), before depositing the fill layer. Although in one or more embodiments the vertical side walls are not atomically smooth after the RIE, thickness of the sacrificial layer still can be closely controlled so that a uniform thin layer separates the fill layer from the substrate. Then when the sacrificial layer is wet etched at the side walls of the filled trench, the sieves may be slightly more irregular in shape but still uniformly thin vertical gaps are formed between the fill layer and the substrate. In one or more embodiments, irregular shapes of the gaps may be advantageous for filtering or trapping particles to be separated from a fluid flowing through the gaps.

One or more embodiments employ lithographically-defined and precisely arranged nanosieve structures suitable for evaluating proteins. One or more embodiments employ slanted sieve arrangements.

Given the discussion thus far, it will be appreciated that, in general terms, an exemplary method, according to an aspect of the invention, includes forming a sacrificial layer along side walls of an array of first trenches that are indented into a surface of a substrate, depositing a fill layer over the sacrificial layer, and then creating an array of gaps between the fill layer and the substrate by removing the sacrificial layer along the side walls of the first trenches, while maintaining a structural connection between the substrate and the fill layer at the floors of the first trenches. The array of gaps extends along the lengths of the array of first trenches. The method further includes covering the substrate, the fill layer, and the array of gaps with a cap layer that forms a fluid-tight seal against the substrate and the fill layer. The method further includes indenting a first reservoir and a second reservoir through the cap layer, and into the substrate and the fill layer, across the lengths of the array of gaps, so that the array of gaps connects the first reservoir in fluid communication with the second reservoir.

In one or more embodiments, the method also includes pressurizing the first reservoir with a fluid having suspended particles, and draining the fluid from the second reservoir, so that the array of gaps permits passage of the fluid from the first reservoir into the second reservoir but prevent passage of the suspended particles from the first reservoir into the second reservoir.

In one or more embodiments, the method includes forming the first trenches in the substrate by reactive-ion etching.

In one or more embodiments, the method also includes maintaining a structural connection between the substrate and the fill layer by removing the sacrificial fill layer from floors of the first trenches before depositing the fill layer, so that the fill layer adheres directly to the substrate.

In one or more embodiments, the substrate is bulk silicon and the fill layer is polysilicon.

In one or more embodiments, the method includes forming the sacrificial layer with a thickness variation of less than 5 nm; alternatively, forming the sacrificial layer with a thickness variation of less than 2 nm; alternatively, forming the sacrificial layer with a thickness variation of less than 5 atoms.

In one or more embodiments, the method includes forming the sacrificial layer by dry oxidation of the substrate.

In one or more embodiments, the method includes forming the first trenches by anisotropic etching of the substrate through windows opened in a hard mask overlying the substrate, and includes opening the windows by lithography. In one or more embodiments, the method includes reducing line edge roughness of the lithography process by forming the sacrificial layer with a thickness variation that is less than the line edge roughness.

In one or more embodiments, the method includes removing the sacrificial layer by a wet etch process that is selective to the sacrificial layer.

In one or more embodiments, the method includes, after depositing the fill layer, exposing the sacrificial layer by planarizing the fill layer.

In one or more embodiments, the method includes, after removing the sacrificial layer, depositing a cap layer to close an end of the gap.

In one or more embodiments, the method includes, after removing the sacrificial layer, growing a hydrophilic layer on facing walls of the fill layer and the substrate. In one or more embodiments, the hydrophilic layer is less than 5 atoms thick. For example, the hydrophilic layer may be a thermal oxide such as silicon dioxide.

According to another aspect of the invention, an exemplary apparatus includes a substrate with an array of first trenches formed in the substrate and with a fill layer deposited into the array of first trenches, so that an array of gaps exists between the fill layer and side walls of the array of first trenches. The apparatus also includes first and second reservoirs indented through the fill layer and into the substrate across the array of first trenches, so that the array of gaps connect the first reservoir in fluid communication with the second reservoir. Furthermore, the apparatus includes a cap layer deposited over the substrate and the fill layer to fluidly seal the array of gaps.

In one or more embodiments, the sacrificial layer is formed with thickness variation less than 5 nm; alternatively, the sacrificial layer is formed with thickness variation less than 5 atoms.

In another aspect, an exemplary apparatus includes a substrate with an array of first trenches formed in the substrate and with a fill layer deposited into the array of first trenches, so that an array of gaps exists between the fill layer and side walls of the array of first trenches. The apparatus includes first and second reservoirs indented through the fill layer and into the substrate across the array of first trenches, so that the array of gaps connect the first reservoir in fluid communication with the second reservoir. The apparatus also includes a cap layer deposited over the substrate and the fill layer to fluidly seal the array of gaps. Furthermore, the apparatus includes a pump for pressurizing the first reservoir to drive fluid flow from the first reservoir through the array of gaps into the second reservoir.

In one or more embodiments, the substrate is bulk silicon and the fill layer is polysilicon.

In one or more embodiments, a width of each gap in the array of gaps is less than 10 nm.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   a substrate;
   an array of first trenches formed in the substrate;
   a fill layer deposited into the array of first trenches, with
      an array of gaps between the fill layer and side walls of
      the array of first trenches;
   first and second reservoirs indented through the fill layer
      and into the substrate across the array of first trenches, wherein the array of gaps connect the first reservoir in fluid communication with the second reservoir; and a cap layer deposited over the substrate and the fill layer to fluidly seal the array of gaps.

2. An apparatus comprising:

a substrate;

an array of first trenches formed in the substrate;

a fill layer deposited into the array of first trenches, with an array of gaps between the fill layer and side walls of the array of first trenches;

first and second reservoirs indented through the fill layer and into the substrate across the array of first trenches, wherein the array of gaps connect the first reservoir in fluid communication with the second reservoir;

a cap layer deposited over the substrate and the fill layer to fluidly seal the array of gaps; and a pump for pressurizing the first reservoir to drive fluid flow from the first reservoir through the array of gaps into the second reservoir.

3. The apparatus of claim 2 wherein the substrate is bulk silicon and the fill layer is polysilicon.

4. The apparatus of claim 2 wherein a width of each gap in the array of gaps is less than 10 nm.

* * * * *